(12) United States Patent
Langseth

(10) Patent No.: US 8,351,113 B2
(45) Date of Patent: Jan. 8, 2013

(54) HIGH POWER FIBER LASER SYSTEM

(75) Inventor: Jason Edward Langseth, Malden, MA (US)

(73) Assignee: Textron Systems Corporation, Wilmington, MA (US)

( * ) Notice: Subject to any disclaimer, the term of this patent is extended or adjusted under 35 U.S.C. 154(b) by 344 days.

(21) Appl. No.: 12/874,559

(22) Filed: Sep. 2, 2010

(65) Prior Publication Data
US 2012/0057220 A1    Mar. 8, 2012

(51) Int. Cl.
*H01S 3/067* (2006.01)

(52) U.S. Cl. .................................. 359/341.3; 372/6

(58) Field of Classification Search ............... 359/341.3; 372/6; *H01S 3/067, 3/23, 3/063*
See application file for complete search history.

(56) References Cited

U.S. PATENT DOCUMENTS

| | | | | |
|---|---|---|---|---|
| 5,761,234 | A * | 6/1998 | Craig et al. | 372/75 |
| 5,864,644 | A * | 1/1999 | DiGiovanni et al. | 385/43 |
| 5,930,030 | A | 7/1999 | Scifres | |
| 6,167,075 | A * | 12/2000 | Craig et al. | 372/75 |
| 6,208,678 | B1 | 3/2001 | King | 372/72 |
| 6,456,637 | B1 * | 9/2002 | Holcomb et al. | 372/40 |
| 6,823,117 | B2 | 11/2004 | Vakili et al. | |
| 6,826,335 | B1 * | 11/2004 | Grudinin et al. | 385/43 |
| 6,944,192 | B2 * | 9/2005 | Prassas et al. | 372/6 |
| 7,046,875 | B2 | 5/2006 | Gonthier et al. | |
| 7,212,553 | B2 * | 5/2007 | Starodoumov et al. | 372/4 |
| 7,400,812 | B2 | 7/2008 | Seifert | |
| 7,409,128 | B2 | 8/2008 | Holcomb et al. | |
| 7,593,435 | B2 | 9/2009 | Gapontsev | |
| 2004/0196537 | A1 * | 10/2004 | Starodoumov | 359/341.3 |
| 2004/0233941 | A1 * | 11/2004 | Fajardo et al. | 372/6 |
| 2005/0105866 | A1 * | 5/2005 | Grudinin et al. | 385/123 |
| 2005/0117860 | A1 * | 6/2005 | Vienne et al. | 385/115 |
| 2005/0201429 | A1 * | 9/2005 | Rice et al. | 372/27 |

(Continued)

FOREIGN PATENT DOCUMENTS

EP    0893862 A2    1/1999

(Continued)

OTHER PUBLICATIONS

Gonthier et al., "High-Power All-Fiber(R) Components: The Missing Link for High Power Fiber Lasers," obtained from http://www.itflabs.com/data/File/Tech/HighPowerAll-Fibercomponents.pdf; undated.

(Continued)

*Primary Examiner* — Mark Hellner
*Assistant Examiner* — Ari M Diacou
(74) *Attorney, Agent, or Firm* — Bainwood Huang

(57) ABSTRACT

A tapered fiber bundle device couples optical power from an optical power source into an output fiber. The tapered fiber bundle device includes a tapered fiber bundle including a set of bundled fibers having a near end and a distal end. The near end of the tapered fiber bundle is configured to collect the optical power from the optical power source. Each fiber k in the set of bundled fibers has a first cross-sectional area $A_k^{(1)}$ at the near end and a second cross-sectional area $A_k^{(2)}$ at the distal end such that $A_k^{(2)}$ is substantially smaller than $A_k^{(1)}$. Each fiber also has a substantially uniform core and a substantially uniform numerical aperture value $NA_{in}$. A cross-sectional area of the set of bundled fibers at the distal end has a cross-sectional area value $A_{dist}$ substantially equal to $A_{out}$.

10 Claims, 7 Drawing Sheets

U.S. PATENT DOCUMENTS

| | | | |
|---|---|---|---|
| 2005/0207455 A1* | 9/2005 | MacCormack et al. | 372/6 |
| 2007/0212006 A1 | 9/2007 | Wysocki | |
| 2008/0002251 A1* | 1/2008 | Tamaoki | 359/341.3 |
| 2008/0018989 A1 | 1/2008 | Tanigawa et al. | |
| 2008/0180787 A1* | 7/2008 | DiGiovanni et al. | 359/334 |
| 2009/0080469 A1* | 3/2009 | Nikolajsen | 372/6 |
| 2010/0111118 A1* | 5/2010 | Seo et al. | 372/6 |
| 2010/0157419 A1* | 6/2010 | Clowes et al. | 359/341.31 |
| 2011/0032603 A1* | 2/2011 | Rothenberg | 359/341.1 |
| 2011/0032604 A1* | 2/2011 | Rothenberg et al. | 359/341.4 |

FOREIGN PATENT DOCUMENTS

| | | |
|---|---|---|
| WO | 2004070897 A2 | 8/2004 |
| WO | 2006/076524 A2 | 7/2006 |
| WO | 2010083595 A1 | 7/2010 |

OTHER PUBLICATIONS

Kosterin, Andrey, "Tapered Fiber Bundles for High Power Applications," Applied Optics, vol. 43, No. 19, Jul. 1, 2004, pp. 3893-3900.

Li et al., "Transmission Properties of a Multimode Optical-Fiber Taper," J. Opt. Soc. Am. A, vol. 2, No. 3, Mar. 1985, pp. 462-468.

Sevigny et al., "Pump Combiner Loss as a Function of Input Numerical Aperture Power Distribution," obtained from http://www.itflabs.com/data/File/ITFLabs/Posters PW2009/PW09 Pump combiner loss as a function of input numerical aperture power.pdf; undated.

Wetter et al., "Tapered Fused-Bundle Splitter Capable of 1kW CW Operation," obtained from http://www.itflabs.com/data/File/Tech/AWetter_PW07_paper_6453-181.pdf; undated.

* cited by examiner

HIGH POWER FIBER LASER SYSTEM

BACKGROUND

In the field of high-power fiber lasers, such as those used in directed energy weapons, lasers employing "eye-safe" wavelengths trail behind those at non-eye-safe wavelengths in terms of output power. A reason lies in the particular advantages of the gain medium commonly used to produce non-eye-safe fiber lasers (Ytterbium-doped glasses) as compared to eye-safe lasers (Erbium and Thulium doped glasses). Erbium fibers emit light between 1.5 µm and 1.6 which is at an eye-safe wavelength (i.e. the light is absorbed in the aqueous humor of the eye instead of the retina) and also transmits well through the atmosphere in dry and maritime environments. For these reasons Erbium is a prime candidate for eye-safe directed energy weapons.

Nevertheless, Erbium has several disadvantages as compared to Ytterbium. The peak absorption cross section of Erbium is a factor of 4.5 lower than that of Ytterbium which makes it more difficult to couple pump light to the actual Erbium ions; typically this requires using a longer fiber to absorb all the pump light (which worsens nonlinear effects), using a larger core/clad area ratio (which requires brighter pump sources), or increasing the doping concentration (which causes clustering and concentration effects in Erbium which reduce the laser efficiency). Incidentally, Ytterbium can also be doped to much higher levels than Erbium without displaying these clustering or concentration quenching effects.

Fiber lasers generally employ a source of "pump" light or a pump beam which is coupled into a "gain fiber" which produces the laser output beam. It is known to use a pump combiner, such as a tapered fiber bundle, to develop a high-power pump beam from multiple lower-power sources. An output gain fiber may be pumped by fiber lasers used as the lower-power sources. In such systems the individual input fibers of the pump combiner are of the same size as and optically coupled (such as by a splice) to respective fibers of the fiber lasers, and the output of the pump combiner is of the same size as and optically coupled to the output gain fiber. The pump combiner obeys a conservation of brightness limitation and thus increases the divergence angle of the pump light while squeezing down the area the pump light occupies in order to couple the pump light into the output fiber. Efficient power transfer requires that the divergence angle to be no greater than an acceptance angle of the gain fiber.

SUMMARY

The conservation of brightness limitation implies that divergence angles in the fibers that make up a tapered fiber bundle increase with a taper ratio which is equal to the square root of the ratio of the input cross-sectional area to the output cross-sectional area of the tapered fiber bundle. High powers dictate that large taper ratios be used in order to take in large amounts of input optical power. The need to match the divergence angle to the acceptance angle of the gain fiber thus places a limit on the taper ratio and hence a limit on the amount of power that can be efficiently accepted into a high-power fiber laser as the output of the tapered fiber bundle is coupled into the laser gain fiber.

It is conventional in fiber laser systems that the core and overall diameters of the fibers of the pump combiner substantially match those of the pump lasers, to minimize optical losses at their respective splices. In this conventional approach, the taper ratio of the pump combiner is the quotient of a cladding-defined input area value and an output area value, where the cladding-defined input area value can be taken as approximately the sum of cross-sectional areas of the pump laser fibers and the output area value is the cross-sectional area of the output fiber. However, the pump light emanating from the pump fiber lasers is substantially confined to the cores, which collectively define a core-defined input area value substantially smaller than the cladding-defined input area value. This effect can be exploited to efficiently couple much more pump light into and through a pump combiner of a given taper ratio.

A technique is disclosed for coupling optical power from an optical power source into an output fiber as a system configured to transform an input optical beam having an input wavelength and an input optical power into an output optical beam having an output wavelength distinct from the input wavelength. The system includes an optical power device configured to provide the input optical beam, and output fiber device including an output fiber and configured to transform a pump optical signal having an intermediate wavelength into the output optical beam, the output fiber having a cross-sectional area value $A_{out}$ and a numerical aperture value $NA_{out}$. The system further includes a set of input fiber devices configured to receive the input optical beam and to generate a pump optical beam therefrom, the input fiber devices including respective input fibers having respective first cross-sectional areas $A_k^{(1)}$, the input fibers having respective cores for carrying the pump optical beam and having respective first cross-sectional core areas. A tapered fiber bundle includes a set of bundled fibers at a near end and an output at a distal end, the near end of the tapered fiber bundle configured to collect the pump optical beam from the input fibers and to provide the pump beam to the output fiber. Each fiber k in the set of bundled fibers is optically coupled to a corresponding one of the input fibers, has a second cross-sectional area $A_k^{(2)}$ substantially smaller than $A_k^{(1)}$ and larger than the cross-sectional core area of the input fiber to which the fiber k is coupled, and has a respective core aligned with and substantially matched to the core of the input fiber to which the fiber k is coupled. A cross-sectional area of the output of the tapered fiber bundle having a cross-sectional area value $A_{dist}$ substantially equal to $A_{out}$.

By use of the bundled fibers with cross-sectional areas smaller than the cross-sectional areas of the input fibers, the taper ratio required for a given number of input fibers is less than that required in a conventional configuration. Thus, it is possible to utilize a larger number of input fibers and thus obtain more pump power for a given maximum taper ratio, or alternatively it is possible to use a lower taper ratio than previously needed for a given number of input fibers to couple pump light into an output fiber having a smaller acceptance angle, for example.

Implementations are directed to the following.

The coupling between the input fibers and the fibers of the tapered fiber bundle may be made by splicing to form a spliced pair.

The wavelength of the optical power from the optical power source can be about 1532 nm.

Each input fiber can carry an optical beam having an optical power of about 200 W and have a width of less than about 25 µm and a numerical aperture value less than or equal to about 0.1.

The tapered fiber bundle can have an input cross-sectional area value $A_{in}$ which is equal to the sum of the cross-sectional areas $A_i^{(2)}$ of each fiber. In this case, the following relationship between input and output cross-sectional area and numerical aperture values can be satisfied:

$$A_{in} NA_{in}^2 \leq A_{out} NA_{out}^2.$$

The input fibers, the fibers of the tapered fiber bundle, and the output fiber can have a circular cross section. Further, the fibers of the tapered fiber bundle can be arranged in an array including 127 fibers.

The input fiber devices can be fiber lasers each of which includes at least one Bragg grating. In such a case, the at least one Bragg grating is configured to transmit an optical beam having an optical power of about 200 W and has a width of less than about 25 μm and a numerical aperture value less than or equal to about 0.1.

Alternatively, input fiber devices can constitute a Er:Yb fiber master-oscillator/power-amplifier (MOPA) and can include at least one single-mode fiber and a set of multimode fibers, the at least one single-mode fiber having a cross-sectional area value $A'^{(1)}_k$, the cross-sectional area value $A'^{(1)}_k$ taken from a subset of the first set of cross-sectional area values. In such a case, each fiber in the set of outer fibers can have a core configured to carry a plurality of optical modes. Also, the central fiber can have a core configured to carry a single optical mode. Further, each fiber in the first set of fibers is configured to transmit an optical beam having an optical power of about 200 W, a width of less than about 25 and a numerical aperture value less than or equal to about 0.1.

The output fiber device can be a Er fiber laser configured to output an optical beam having an optical power of about 20 kW and a wavelength greater than about 1550 nm. In such a case, the optical beam can include a single mode and can be diffraction-limited.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

Figure 1:
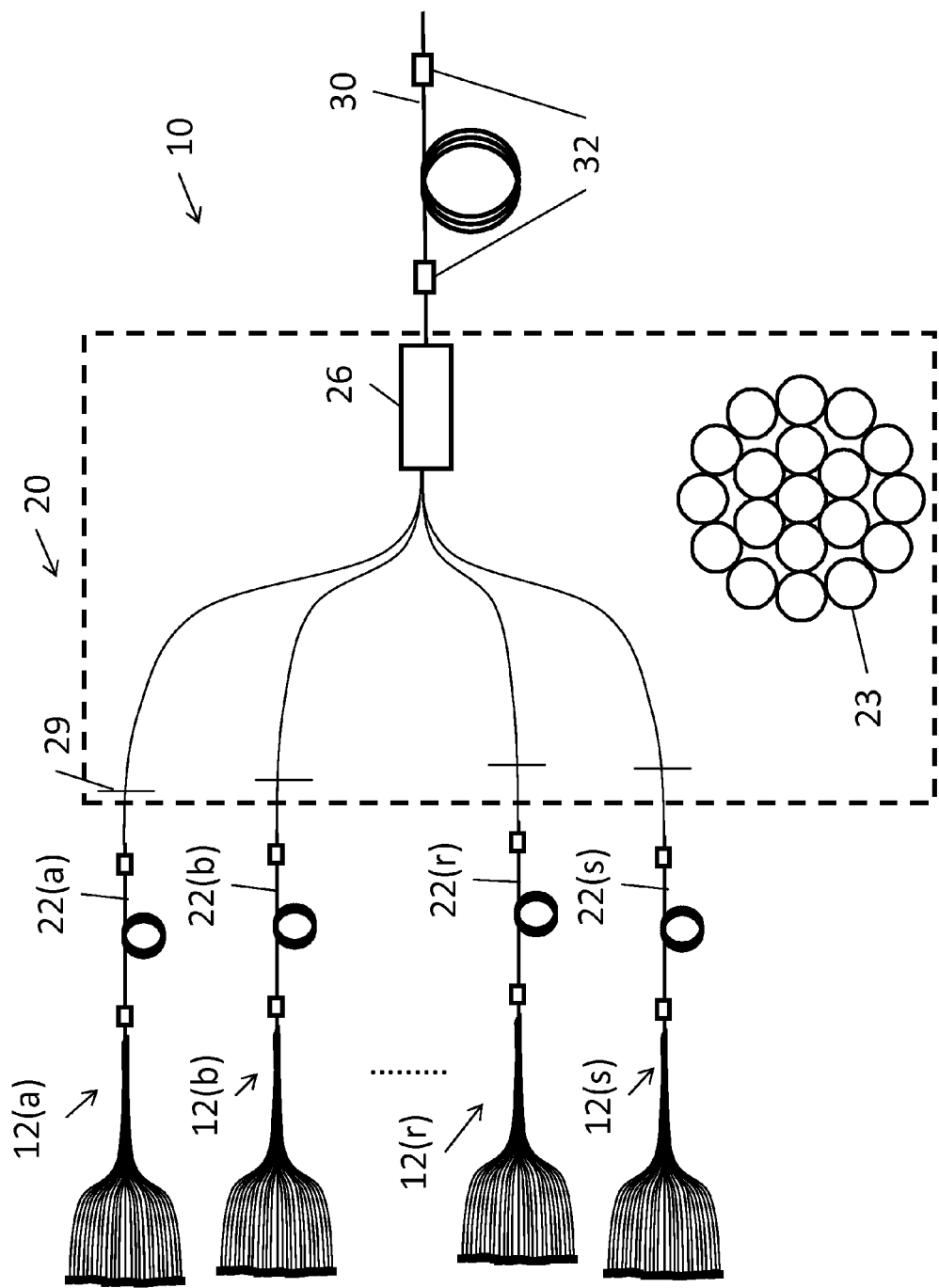
FIG. 1 is a block diagram of a system configured to couple optical power from an optical power source into an output fiber.

FIG. 1 shows a system 10 which is suitable for use by the improved technique. System 10 includes sources of optical power 12(a), 12(b), . . . , 12(r), 12(s), . . . [sources 12], input fiber devices 22(a), 22(b), . . . , 22(r), 22(s), . . . [input fiber devices 22], and an output fiber device 30.

Overall the system constitutes a fiber laser which employs constituent fiber lasers (input fiber devices 22) as pump sources for the output fiber device 30. This configuration takes advantage of certain features of Er:Yb fiber lasers as pump sources as described below.

Sources of optical power 12 include, for example, an array of Gallium Arsenide (GaAs) laser diodes having an output wavelength of about 976 nm. The outputs of several laser diodes may be combined together in a respective tapered fiber bundle at the input (left side in FIG. 1) each coupled to an Er:Yb fiber laser 22 which produces coherent radiation at 1532 nm.

Output fiber device 30 is a fiber laser device, although alternatively it can be a fiber amplifier device. Output fiber device 30 includes a fiber and a pair of Bragg gratings 32. The fiber is a double-cladding fiber with a core, an inner cladding, and an outer cladding, although a fiber with a single cladding can also be used. The core is doped with Erbium ($Er^{3+}$) ions in order to facilitate emission of light having a wavelength between 1.5 μm and 1.6 μm. The core is designed to support a single optical mode of propagation, which implies a core diameter of between about 5 μm and about 20 μm in diameter, although larger cores supporting additional modes can be considered in alternative configurations. The relative index between the core and inner cladding is very close to one so that the numerical aperture at the core/inner cladding interface is less than about 0.1. The numerical aperture of the fiber at the outer cladding, or jacket, and air interface is about 0.46. The cladding materials are made from fluoroacrylate, although other materials that meet optical and physical requirements of the output fiber can alternatively be used.

Bragg gratings 32 take the form of index modulations within the core of the fiber. The modulations within the core can be achieved through a lithographic procedure such as a two-beam interference or a photomask process. Index profiles of Bragg gratings 32 may be chirped, but alternatively the profile can be apodized-Gaussian or uniform. The periods of Bragg gratings 32 depend on wavelengths of interest. With a pair of Bragg gratings 32, light is input into the fiber and is transmitted by a first Bragg grating. The transmitted light is absorbed by the $Er^{3+}$ within the core and the resulting excited ions spontaneously emit output light of a different wavelength. This light is reflected and partially transmitted by Bragg gratings 32, resulting in a lasing effect within the fiber core and allowing for a high-power output at a desired wavelength.

High powers have been obtained from Erbium fibers by co-doping an Erbium fiber with Ytterbium. The Ytterbium is pumped with 976 nm diodes, and the Ytterbium then transfers its energy to the Erbium in the fiber, which then can emit light at wavelengths greater than 1530 nm. Unfortunately the energy transfer from Ytterbium to Erbium is not 100% efficient, limiting overall laser efficiency and resulting in a large quantum defect between pump (976 nm) and laser (greater than 1530 nm) energies causing unmanageable levels of waste heat at kilowatt power levels. Worse, untransferred energy from Ytterbium to Erbium leaves the Ytterbium in its upper state, which can then result in light emission at Ytterbium wavelengths, i.e. 1030-1100 nm. At power levels of typically several hundred watts, parasitic Ytterbium lasing and amplified spontaneous emission (ASE) can become significant, resulting in a clamping of the power level at the longer (Erbium) wavelength (i.e. 1532 nm). For this reason Er:Yb fibers are unscalable to kilowatt power levels.

Nevertheless, the Er:Yb fiber laser has some applicability if limited to roughly 200 W of power by parasitic Ytterbium light. In this case, this 200 W of power is emitted in a narrow divergence angle (the fiber NA is typically <0.1) and in a very small area (25 µm diameter). Furthermore, the Er:Yb fiber laser can be constructed to emit at 1532 nm, a wavelength needed for the pumping of an Erbium fiber.

As a pump for an Erbium fiber, an Er:Yb fiber laser has significantly higher power and brightness than traditionally used Indium Phosphide (InP)-based diodes. The 976 nm diode pumps which are used to pump Er:Yb, can reach efficiency levels of greater than 70%. Also, Er:Yb fiber lasers are approaching 50% efficiency. Thus, Er:Yb fiber lasers have the potential to be as efficient as current InP 1532 nm diodes, but with much better power and brightness characteristics.

Thus the input fiber devices 22 constitute several 200 W, 1532 nm, Erbium/Ytterbium fiber lasers whose respective outputs are combined into an Erbium multimode fiber (of output fiber device 30) of the type typically used to capture light from InP diodes. This is accomplished using a multimode pump combiner 26 (also referred to as "tapered fiber bundle" herein) which combines light from the input fiber devices 22 into a single output. The tapered fiber bundle 26 includes input-side fibers arranged in an array 23 defining a certain overall cross-sectional area and diameter when fibers having circular cross-sections are employed. Such an array 23 assumes that the TFB includes 1, 7, 19, . . . , or generally, $3N^2+3N+1$ fibers for some integer N, although other arrangements are possible. Splice 29 which joins the input fiber devices 22 to the pump combiner 26 provides advantages which will be explained in detail below with reference to FIG. 4.

Figure 2:
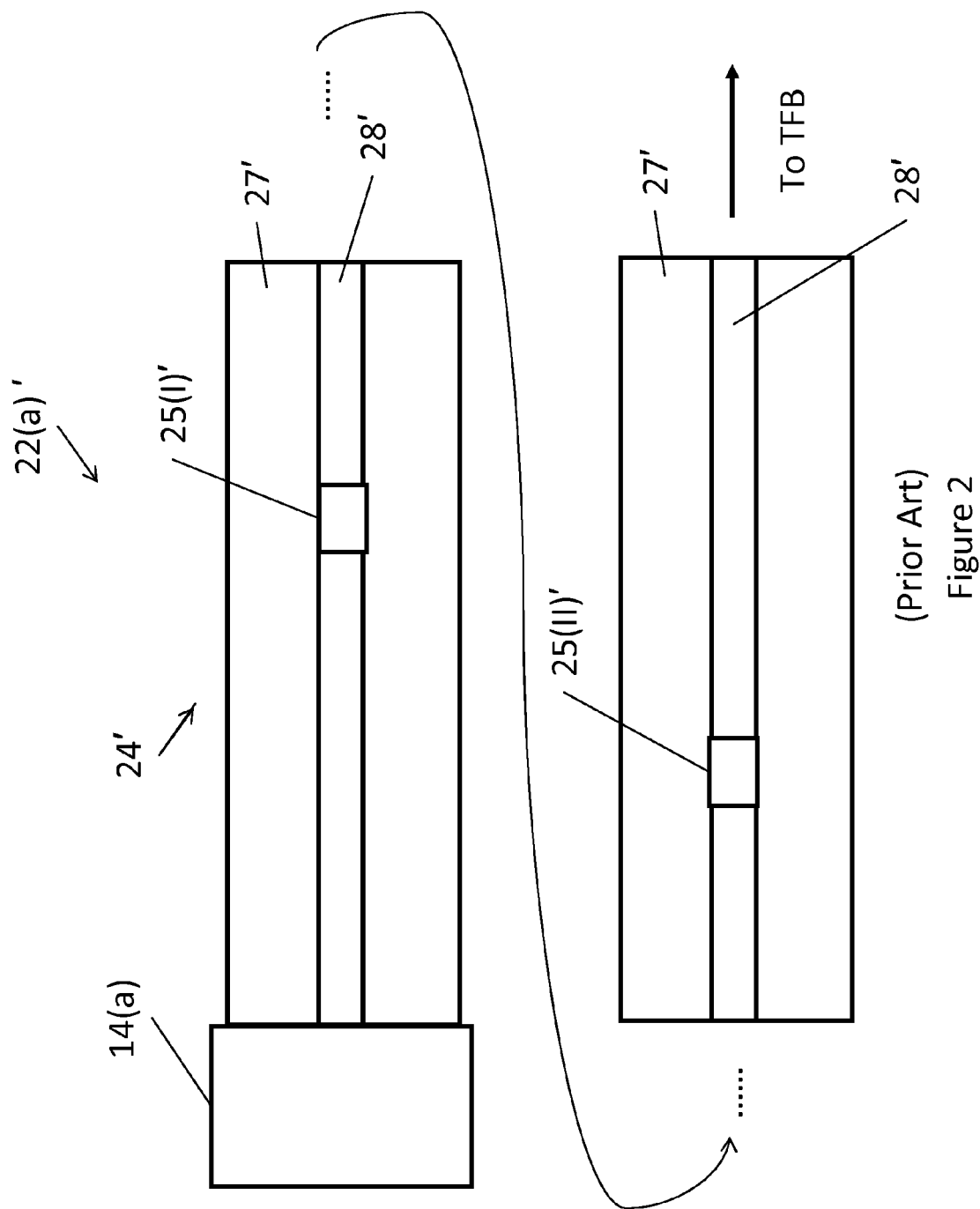
FIG. 2 is a schematic diagram of fiber in a tapered fiber bundle.

FIG. 2 illustrates a single fiber device 22(a)' in a prior art arrangement. Light from an optical power source is coupled into fiber 24' through coupling device 14(a). Fiber 24' has a core 28' and cladding 27'. Core 28' is large enough to support multiple modes, i.e., has a diameter of about 25 µm and is made from quartz, although alternatively core 28' can be made from fused silica. Because the fiber device 22' functions to convert light from a 976 nm input to output light at 1532 nm, the core 28' of fiber 24' is doped with Erbium and Ytterbium ($Er^{3+}:Yb^{3+}$) ions.

Cladding 27' is designed such that a numerical aperture at the core/cladding interface is small, i.e., less than or equal to about 0.12. Cladding 27' has a large diameter, i.e., of about 300µ, in order to maximize the collection of input light from the sources 12. Cladding 27' is a double cladding having an inner cladding and an outer cladding.

Because fiber device 22(a)' functions as an optical gain medium, fiber device 22(a)' can be configured as a fiber laser or a fiber amplifier. When fiber device 22(a)' is configured as a fiber laser, the core 28' of fiber 24' includes a pair of Bragg gratings 25(I)', 25(II)' [Bragg gratings 25'] which function as resonators. An optical beamlet is produced at the output of the fiber laser 22(a)' [i.e., transmitted by the downstream Bragg grating 25(II)'] which may have a power on the order of 200 W, a width smaller than about 25 µm at a numerical aperture less than about 0.1.

By combining the light from several (e.g., nineteen) such fibers 22', it is possible to obtain several kilowatts of 1532 nm pump light. The combination of beamlets enables kilowatts of high-brightness, long-wavelength (>1550 nm) light from an Erbium output fiber 30. Such a system thus enables long-wavelength, eye-safe directed energy weapons based on Erbium fiber. The small quantum defect between pump (1532 nm) and laser (greater than 1550 nm) energies in Erbium now enables the Erbium fiber to handle the kilowatt level powers, because there is very little waste heat dissipated. Most of the waste heat in the system will be dissipated in the Er:Yb fiber lasers 22', which are operating at much lower power levels where the heat can be more easily dissipated. Furthermore, the waste heat is spread out among the many 200 W Er:Yb fiber lasers that are combined into the pump for the Erbium fiber.

Alternatively, fiber device 22(a)' is a fiber amplifier capable of the same output as the fiber laser described above. A reason one may prefer an amplifier over a laser could be due to better linewidth [i.e., spectral linewidth] control at the output. A system using the fiber devices 22' as amplifiers would take the form of a master oscillator/power amplifier (MOPA), and will be described below with reference to FIG. 6(b).

As described above, the diameter of a fiber 24' of fiber device 22(a)' is about 300 µm, matching the diameter of the tapered fiber bundle combining the sources 12 which is large in order to maximize acceptance of photons from the optical power sources 12. The fiber devices 22' generate a pump optical beam whose optical power is to be coupled to the output fiber 30 via a tapered fiber bundle 26'. In the tapered fiber bundle, limitations due to divergence angle increases appear, and it is worth exploring their mechanisms in some detail.

Figure 3:
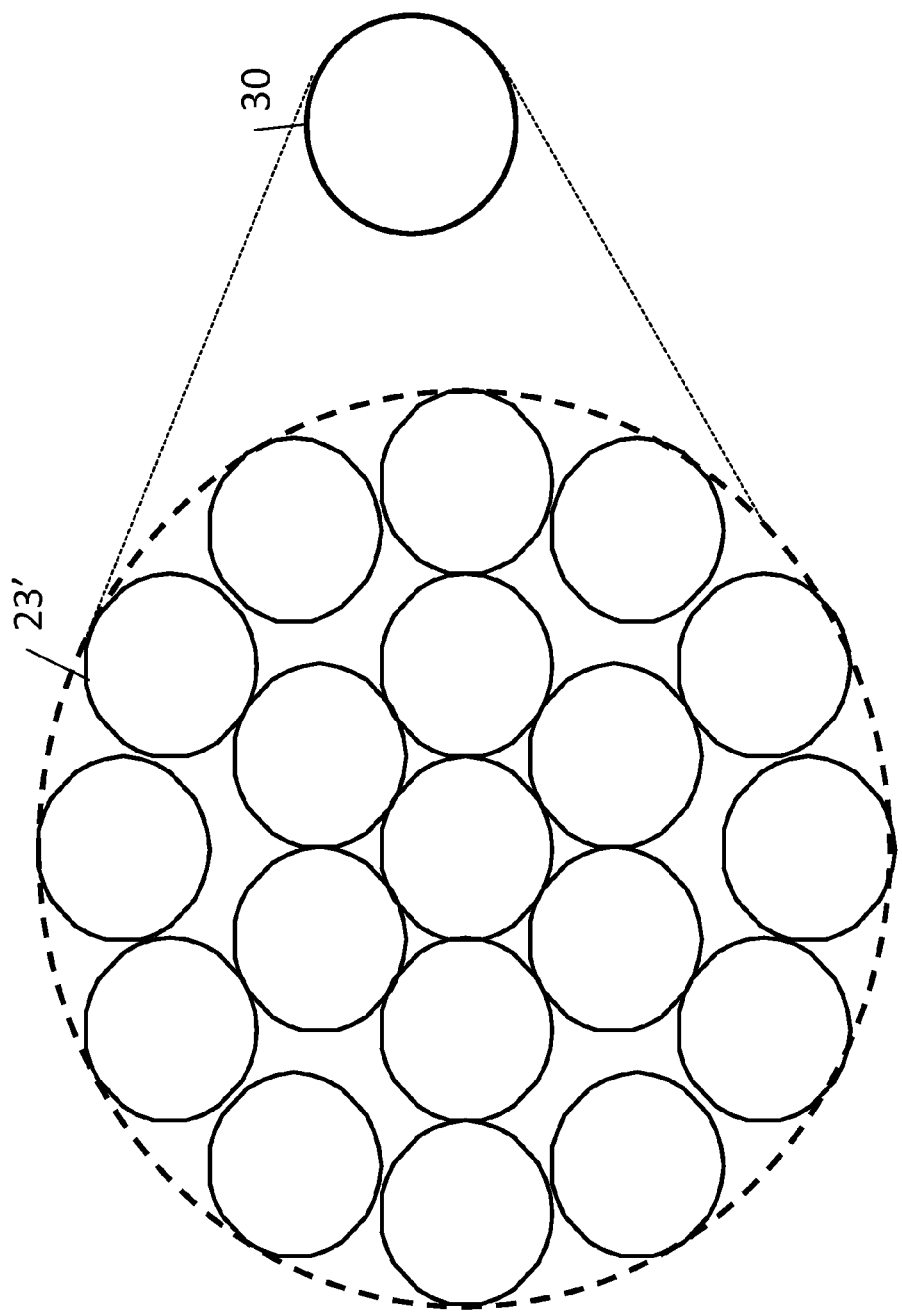
FIG. 3 is a schematic drawing of a cross section of a fiber bundle relative to a cross-section of an output fiber.

FIG. 3 illustrates this detail. In FIG. 3, the geometry of a tapered fiber bundle 23' relative to output fiber 30 is presented for the case of nineteen fibers and represents views at each end of a prior art coupler 26' (not shown). A condition that the fiber bundle satisfies is referred to as &endue conservation; that is, the following relation between input and output cross-sectional areas and numerical apertures is to be satisfied:

$$A_{in}NA_{in}^2 \leq A_{out}NA_{out}^2,$$

where $A_{out}$ is the cross-sectional area of the output fiber 30, $NA_{out}$ is the numerical aperture of the output fiber 30, $NA_{in}$ is the numerical aperture of a fiber 24' from a fiber device (e.g., 22(a)'), and $A_{in}$ is the effective cross-sectional area of the bundle at the upstream end of the bundle. That is, $A_{in}$ is the cross-sectional area occupied by the fibers 24' as indicated by the circular dotted line in FIG. 3.

With the parameters $NA_{in}=0.12$ and $NA_{out}=0.46$ described above, étendue conservation as embodied in the inequality above would imply that $$A_{in} \leq \left(\frac{0.46}{0.12}\right)^2 A_{out},$$

or $A_{in} \leq 14.7 A_{out}$. For circular cross-sections, this implies that the diameters satisfy $d_{in} \leq 3.83 d_{out}$, which represents a limit on the input bundle diameter $d_{in}$ for a given $d_{out}$. Thus, tapered fiber bundles for directed energy weapons impose a limitation on the power due to increases in the divergence angle of the beam from the tapered fiber bundle. Such power limitations may be critical in determining the viability of such weapons.

As described above, the improved technique detailed here relates to systems, devices, and methods for increasing available pump power in the final gain stage. The technique involves splicing a fiber of a smaller diameter onto the larger-diameter fiber 24. In this way, the light from more input fiber devices 22 can be by directed into a tapered fiber bundle 26 within the power-conserving area/diameter constraints described above.

Figure 4:
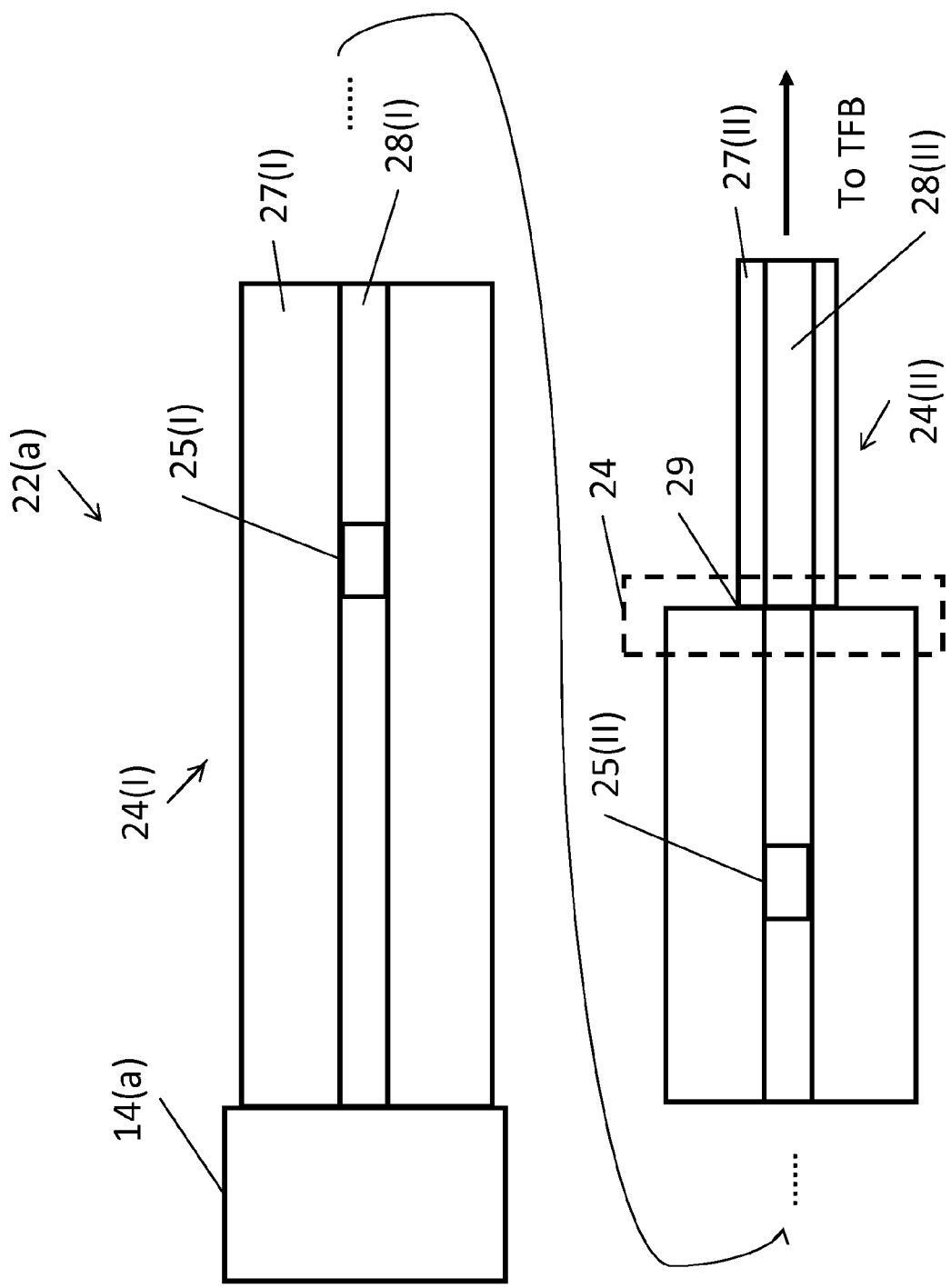
FIG. 4 is a schematic diagram of spliced fiber pair in a tapered fiber bundle.

FIG. 4 illustrates the single fiber device 22(a) whose fibers 24(I) are of the same size as the fibers 24' of FIG. 3 (e.g., 300 um diameter). The pump combiner 26 employs smaller-diameter fibers 24(II) each spliced to a corresponding larger fiber 24(I) at a splice junction 29. Fibers 24(I) and 24(II) may have substantially identical cores 28(I), 28(II) and claddings 27(I) and 27(II) in the sense that the cores and claddings are made from the same respective materials. The cores 28(I) and 28(II) are of the same diameter and are aligned, and the respective NAs are substantially identical. Smaller fiber 24(II) has a cladding 27(II) of a smaller outer diameter than that of fiber 24(I); for example, the diameter of fiber 24(II) is 80 μm compared to the 300 μm cladding diameter of fiber 24(I). The material in cladding 27(II) is generally chosen to minimize losses at the splice junction 29, and a simple choice is to match the material found in cladding 27(I) at the splice junction 29. Fibers 24(I) and 24(II) form a spliced pair 24. Splicing of fibers in the manner described here can be accomplished using generally known techniques. For example, splicing tools using such techniques are made by Vytran LLC of New Jersey.

Nevertheless, such splices can result in imperfect performance. During the splicing process, surface tension effects will create a taper from the smaller diameter fiber 24(II) to the larger diameter fiber 24(I). Such surface tension effects can cause a distortion of cores 28(I) and 28(II). A solution to this problem might be thought to be in reducing the amount of heat applied during the splicing process in order to preserve a stairstep appearance of a dissimilar fiber diameter splice. While this "cold" splicing can succeed in eliminating tapering effects, such cold splices can also result in higher reflectivity at the splice junction than standard splices, which have a nearly negligible reflectivity value of less than about −90 dB. Further, cold splices can result in weaker bonds at the splice junction 29.

As an alternative, larger fiber 24(I) can be etched using an HF acid solution until its diameter has been reduced to the diameter of the smaller fiber 24(II). This will have substantially no effect on the size or composition of core 28(I). The stairstep profile sought is an automatic result of the etching. The splicing of fiber 24(I) to fiber 24(II), with fiber 24(I) having the stairstep profile with a smaller diameter matched to the fiber 24(II) becomes straightforward.

The technique illustrated in FIG. 4 can be used for efficient light transfer across the splice 29 because at the output end of the fibers 24(I) substantially all the output light is 1532 nm light confined to the core 28(I). Substantially all the 976 nm pump light received at the input end has been converted into the core-confined output light. It is possible to capture this core-confined light using fibers 24(II) having a smaller-diameter cladding 27(II), which translates to an overall smaller diameter of the fibers 24(II).

Note that the spliced geometry illustrated in FIG. 4 is one instance of a more general approach of collecting the input power from input fibers 24 at a near end of the tapered fiber bundle 26 in a way that captures substantially all the light from the fibers 24 while the cross-sectional areas of the collecting fibers are substantially smaller at a distal end, say greater than 5 times as small, greater than 7 times as small, or greater than 10 times as small. By using such smaller fibers after the splice 29, many more fibers can be used within the same cross-sectional area, thus increasing the power limitation attributable to the tapered fiber bundle as described above.

Figure 5:
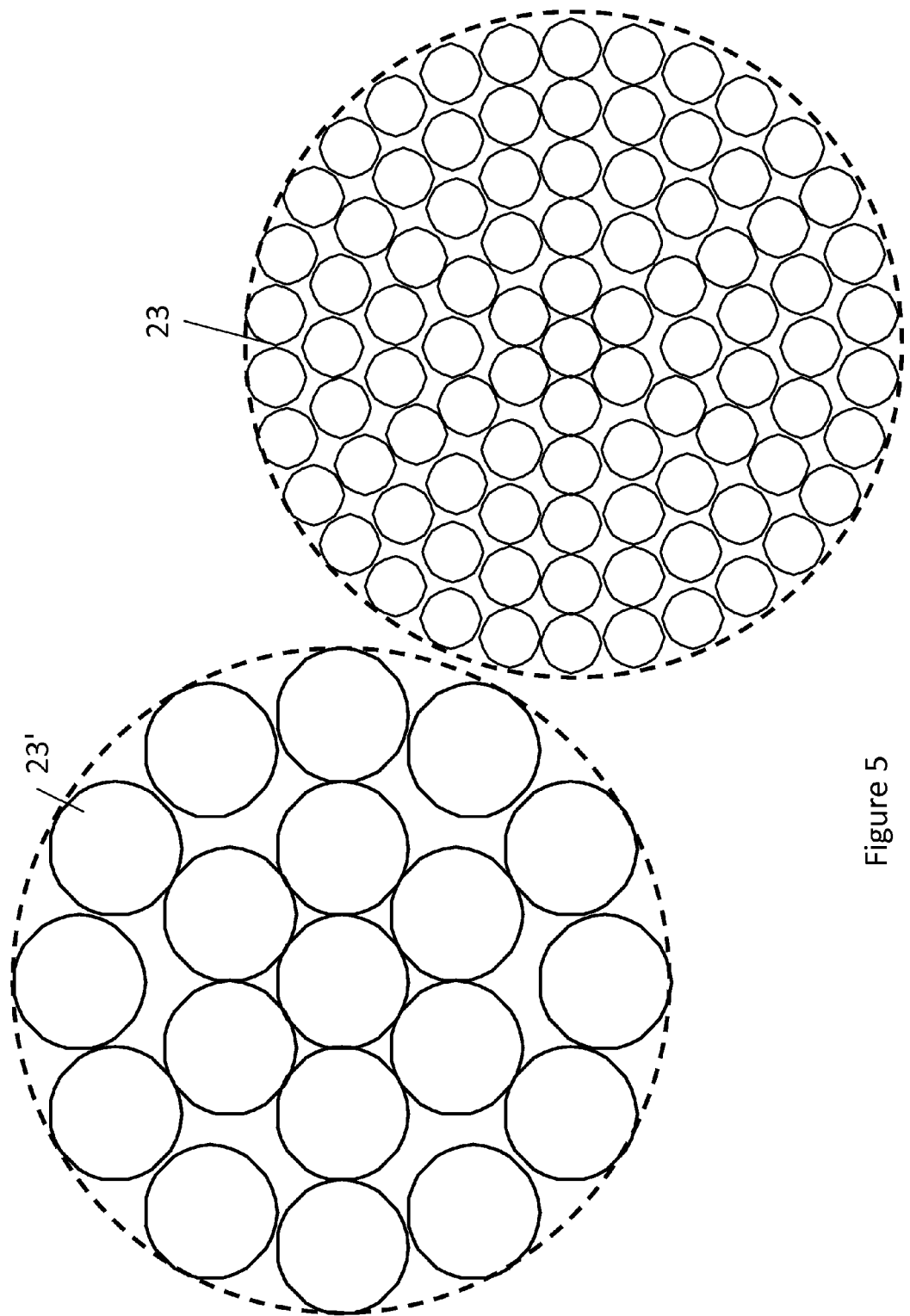
FIG. 5 is a schematic drawing of a comparison of cross sections of fiber bundles between the prior art and instant invention.

FIG. 5 illustrates cross-sectional geometry of the fibers 24 of the fiber devices 22 spliced to the tapered fiber bundle 23 [using 127 fibers] compared with the prior art configuration with tapered fiber bundle 23' [using 19 fibers] described above. Note that, when the same core and cladding materials and core size are used for the smaller fiber 24(II) as for the larger fiber 24(I), the numerical apertures can be precisely matched. As shown in FIG. 5, 127 smaller fibers 24(II) occupy approximately the same area as do 19 of the larger fibers 24(II)'. Thus it will be appreciated that the amount of power that may be coupled to output fiber 30 is approximately 7 times greater (127/19) than in the prior art configuration illustrated in FIG. 2.

A somewhat more general description of the above analysis is now provided. This analysis assumes that the number of fibers 24(II) used in the tapered fiber bundle 26 has the above form of $3N^2+3N+1$ fibers for an integer N. Based on the conservation considerations as described above, it can be shown that, for circular cross-sections, the maximum number for N is $$N_{max} = \left\lfloor \frac{1}{2}\left(\frac{D_{out}NA_{out}}{D_{in}NA_{in}} - 1\right)\right\rfloor,$$

where $D_{out}$ and $D_{in}$ are the diameters of the output fiber 30 and each input fiber 24(II) respectively on the TFB 26. For an example with $D_{out}$=250 $NA_{out}$=0.46, $D_{in}$=300 and $NA_{in}$=0.1, $N_{max}$ is 1. This implies that the tapered fiber bundle 26 can have no more than 7 input fibers. When $D_{in}$ is reduced to 80 μm as in the above example, $N_{max}$ becomes 6, and the maximum number of input fibers is 127. For purposes of the present description, a limit of the first type in which $D_{in}$ is substantially equal to the diameter of the input fibers 24(I) is denoted a "cladding-defined limit", because it arises from matching the overall diameter including the entire cladding of the input fibers 24(I). Because the light to be captured is confined to the core of the input fibers 24(I) as in the example of FIG. 4, the increased limit is referred to as a "core-defined limit" which corresponds to a smaller diameter of the fibers 24(II) just sufficient to capture all the core-confined light.

It should be noted that there is no requirement for all the fibers 24(II) of the TFB 26 to be of the same diameter. In many cases, including systems in which the output fiber device 30 is configured as a laser, they will be. In other cases, notably including systems in which the output fiber device 30 is to act as an optical amplifier, it may be desirable that at least one of the fibers 24(II) has a different diameter than others.

Operation of a system using the configuration of FIG. 1 as described above depends on whether the fiber devices 22 are fiber lasers or fiber amplifiers.

Figure 6:
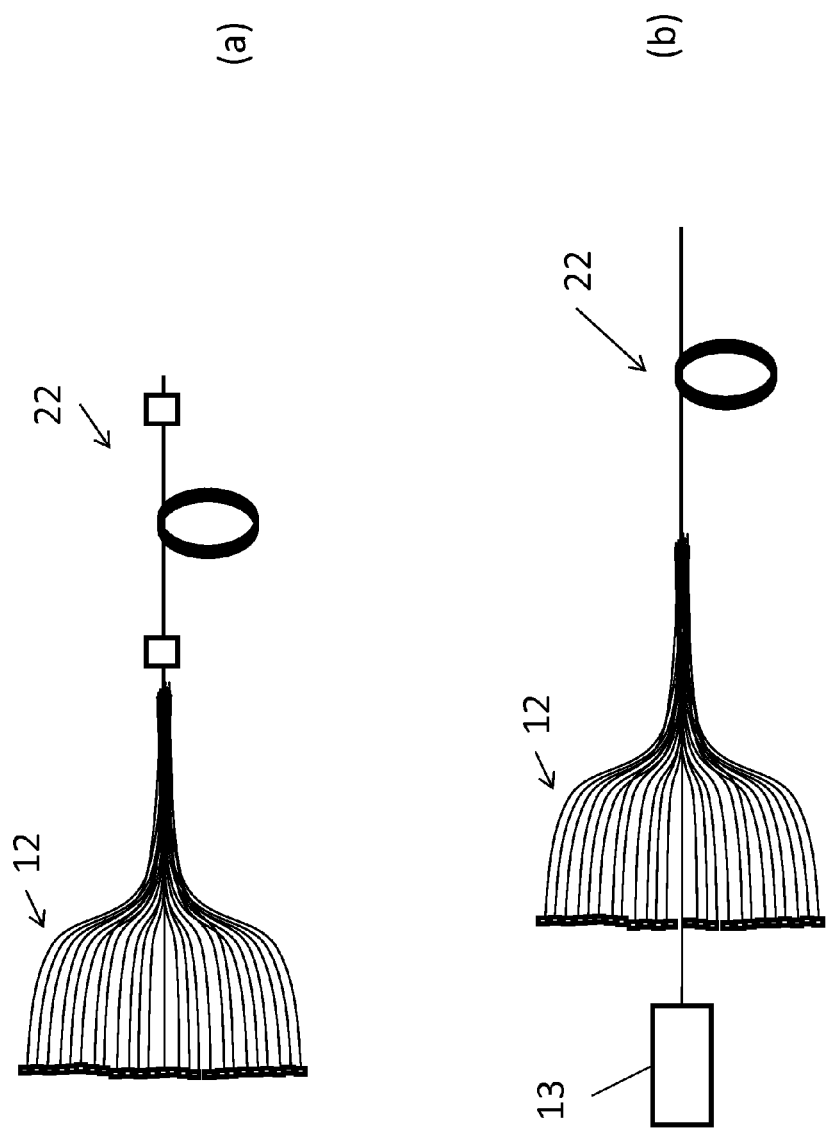
FIG. 6(a) is a block diagram of a Er:Yb fiber laser system powered by a diode pump laser.
FIG. 6(b) is a block diagram of a Er:Yb fiber master-oscillator/power-amplifier (MOPA) system.

FIG. 6(a) illustrates a first stage of such a system in which the fiber devices 22 are fiber lasers. In this case, the optical power sources 12 are diode lasers outputting light with a wavelength of about 976 nm as described above. Such 976 nm diode lasers are available from JDS Uniphase of Ontario, Canada. 976 nm light is coupled into each fiber laser 22 and is transmitted through respective Bragg gratings 25(I) [see FIG. 4]. The 976 nm light in the core is absorbed by the Ytterbium ions in the core; the excited Ytterbium ions transfer energy to neighboring Erbium ions, which spontaneously emit light having a wavelength at about 1532 nm. This 1532 nm light is subject to reflection and transmission by Bragg Gratings 25. Through this resonance, about 200 W of power at 1532 nm is produced from each fiber laser. This pump light is confined to the core of the fiber 24 of each fiber laser 22.

It is generally undesirable for any remaining 976 nm light propagating in cladding modes to be emitted from the end of the fiber 24. Thus it will often be useful to employ a so-called "cladding mode stripper" to safely remove these undesired cladding modes.

Because the cores and the numerical apertures are uniform throughout the spliced pair 24, there is little to no reflection at splice 29, nor are there new higher-order modes of propagation introduced at splice 29. The 1532 nm pump light propagating in the core of larger fiber 24(I) is efficiently coupled into the core of smaller fiber 24(II).

The output of the tapered fiber bundle 26 has a diameter about equal to that of the output fiber device 30. The output fiber device 30 converts the pump power from the tapered fiber bundle 26 into a single-mode, diffraction-limited output beam. The power supplied to the output fiber 30 can be computed from knowing the output power from each of the fibers in the tapered fiber bundle. Because the tapered fiber bundle has 127 fibers each providing about 200 W of power, the power input into the output fiber device 30 is about 200 W×127 fibers=25.4 kW. With such input power, greater than 20 kW power levels can be achieved at an output wavelength larger than 1550 nm.

FIG. 6(b) illustrates a system in which the fiber devices 22 are fiber amplifiers, and the system takes the form of a MOPA. In this case, operation is generally identical to the system including fiber lasers as described above. Nevertheless, in the MOPA, there is a central fiber device which is designed to propagate a single mode rather than multiple modes as to the other fiber devices. This central fiber device is not coupled to a 976 nm diode, but rather to a low-power 1532 nm master oscillator.

Figure 7:
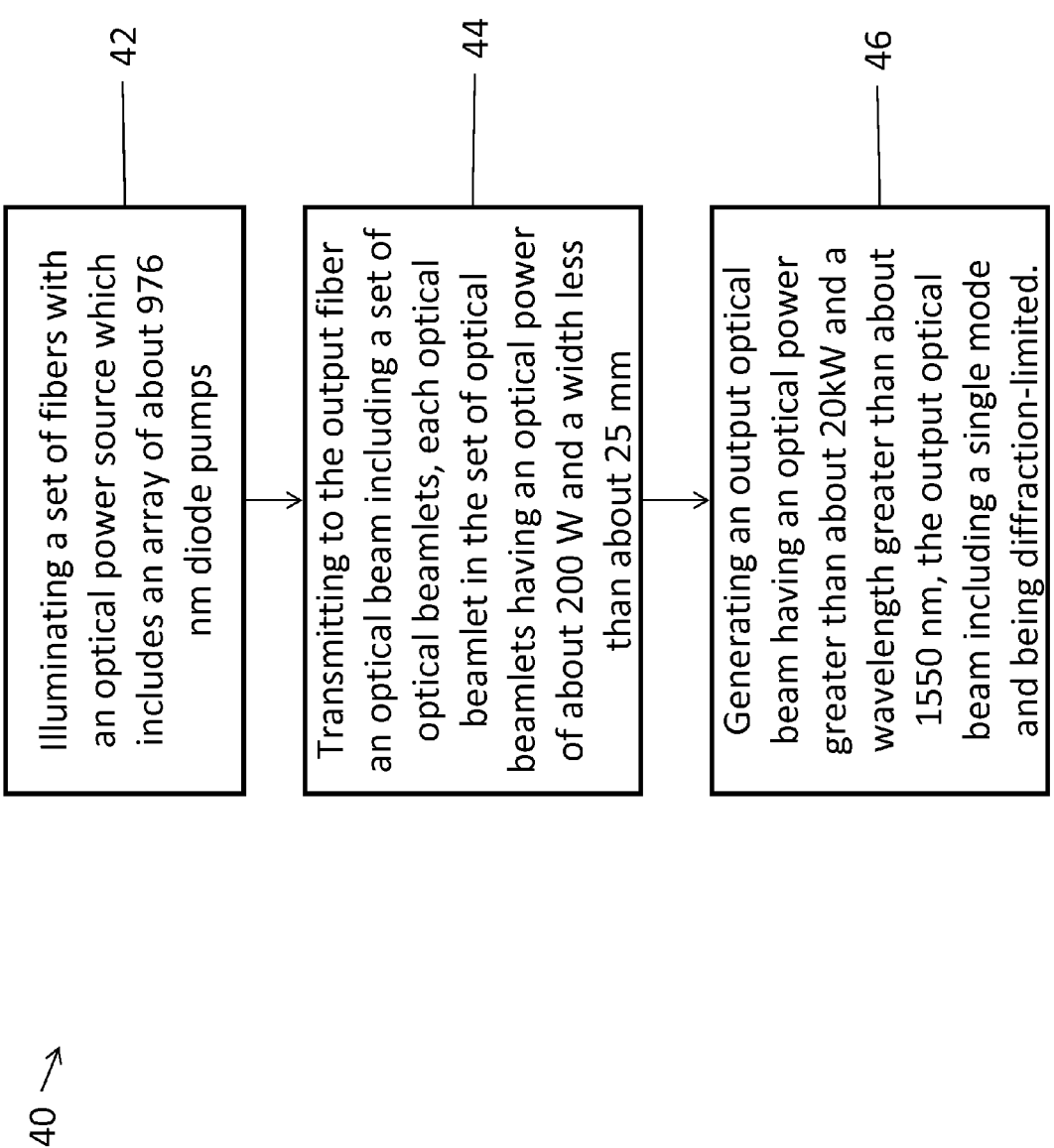
FIG. 7 is a flow chart outlining the technique of coupling optical power from an optical power source into an output fiber.

FIG. 7 illustrates a method 40 of generating an optical beam from an output fiber according to the technique described above. In step 42, a set of fibers are illuminated with light from an optical power source which includes an array of 976 nm diode pumps. In step 44, an optical beam including a set of optical beamlets, each optical beamlet in the set of optical beamlets having an optical power of about 200 W and a width less than about 25 μm, is transmitted to the output fiber. In step 46, an output optical beam having an optical power greater than about 20 kW and a wavelength greater than about 1550 nm is generated, the output optical beam including a single mode and being diffraction-limited.

The illuminating of the fibers depends on the system used to provide the gain to the output fiber. If the system generally includes a set of fiber lasers within a tapered fiber bundle, then the diode lasers illuminate all fiber devices in the tapered fiber bundle. If the system includes a MOPA, then at least one of the illuminators is a master oscillator having a wavelength distinct from the 976 nm pump diodes.

The transmitting of the optical beam includes coupling, by a tapered fiber bundle, the optical beam to the output fiber. The optical beamlets can be produced by input fiber gain devices which can include fiber lasers or fiber amplifiers. The fibers in the tapered fiber bundle are spliced to the input fibers as described above.

The generating of the output optical beam takes place within the output fiber device 30, which is an Erbium-doped fiber laser or MOPA.

Although the system as described above with reference to FIG. 1 has input fiber devices 22 directly spliced to corresponding fibers of the TFB 26, it may be desirable in alternative configurations to employ a TFB device 20 which includes the TFB 26 having short sections of larger-diameter fiber spliced to the front end of the smaller-diameter input fibers 24(II) by splices 29. Because of the different-size fibers at the splice 29, it may be preferable for this special splice to be made by a party which manufactures the TFB device 20 as a component for integration into laser systems. A system integrator then need only splice the fibers of the input fiber devices 22 to the larger-diameter fibers, whose diameters are selected to match those of the input fiber devices 22. The splicing together of same-diameter fibers is a less specialized operation that may be more suitably performed by a laser system integrator.

While various embodiments of the invention have been particularly shown and described, it will be understood by those skilled in the art that various changes in form and details may be made therein without departing from the spirit and scope of the invention as defined by the appended claims.

What is claimed is:

1. A system configured to transform an input optical beam having an input wavelength, an input brightness, and an input optical power into an output optical beam, the output optical beam having an output wavelength distinct from the input wavelength, the system comprising:
    an optical power device configured to provide the input optical beam;
    an output fiber device including an output fiber, the output fiber device configured to transform a pump optical signal having an intermediate wavelength into the output optical signal, the output fiber having a cross-sectional area value $A_{out}$ and a numerical aperture value $NA_{out}$;
    a set of input fiber devices configured to receive the input optical beam and to generate a pump optical beam therefrom, the input fiber devices including respective input fibers having respective first cross-sectional areas $A_k^{(1)}$, the input fibers having respective cores for carrying the pump optical beam; and
    a tapered fiber bundle including a set of bundled fibers at a near end and an output at a distal end, the near end of the tapered fiber bundle configured to collect the pump optical beam from the input fibers and to provide the pump optical signal to the output fiber, each fiber k in the set of bundled fibers:
        being optically coupled to a corresponding one of the input fibers;
        having a respective core aligned with and substantially the same diameter as the core of the input fiber to which the fiber k is coupled; and
        having a second cross-sectional area $A_k^{(2)}$ substantially smaller than $A_k^{(1)}$;
    a cross-sectional area of the output of the tapered fiber bundle having a cross-sectional area value $A_{dist}$ substantially equal to $A_{out}$.

2. A system as in claim 1, wherein each of the input fibers has a uniform cross-sectional area $A_k^{(1)}$ and forms a spliced pair with the corresponding fiber in the set of bundled fibers, each fiber in the set of bundled fibers having a uniform cross-sectional area $A_k^{(2)}$ substantially smaller than the input fiber of the spliced pair.

3. A system as in claim 2, wherein each of the input fibers further includes, at an end of the input fiber, a reduced section having a uniform cross-sectional area $A_k^{(2)}$;
    wherein the spliced pair forms a splice junction at the joining of the end of the reduced section to an end of the corresponding fiber of the input fiber.

4. A system as in claim 2, wherein the set of bundled fibers defines an input cross-sectional area value $A_{in}$ which is equal to a cross-sectional area of an enclosure about the set of bundled fibers;
    wherein the following relationship between input and output cross-sectional area and numerical aperture values is satisfied:

$$A_{in} NA_{in}^2 \leq A_{dist} NA_{dist}^2.$$

5. A system as in claim 4, wherein the input fibers, the fibers in the set of bundled fibers, and the output fiber have a circular cross section; and
    wherein the set of bundled fibers is arranged in an array including 127 fibers.

6. A system as in claim 5, wherein each of the input fiber devices includes an optical gain medium configured to transform the input wavelength of the optical power source to a different, pump wavelength;
   wherein the core of the optical gain medium is doped with a rare earth metal, the rare earth metal configured to perform the transforming of the input wavelength of the optical power source to the different, pump wavelength.

7. A system as in claim 6, wherein the rare earth metal is Er:Yb;
   wherein the optical power source includes an array of diode lasers, each diode laser in the array of diode lasers having a wavelength of about 976 nm; and
   wherein the intermediate wavelength is about 1532 nm.

8. A system as in claim 7, wherein the optical gain medium is a fiber laser including at least one Bragg grating and is pumped by a diode laser from the array of diode lasers;
   wherein the at least one Bragg grating is configured to transmit an optical beam having:
      an optical power of about 200 W;
      a width of less than about 25 μm; and
      a numerical aperture value less than or equal to about 0.1.

9. A system as in claim 7, wherein the optical gain medium is a Er:Yb fiber master-oscillator/power-amplifier (MOPA) and includes at least one single-mode fiber and a set of multimode fibers;
   wherein each fiber in the set of multimode fibers has a core configured to carry a plurality of optical modes and is pumped by a diode laser from the array of diode lasers;
   wherein the at least one single-mode fiber has a core configured to carry a single optical mode and is pumped by a master oscillator having a wavelength of about 1532 nm;
   wherein each MOPA is configured to transmit an optical beam having:
      an optical power of about 200 W;
      a width of less than about 25 μm; and
      a numerical aperture valueless than or equal to about 0.1.

10. A system as in claim 7, wherein the output fiber device is a Erbium fiber laser configured to output an optical beam having an optical power greater than about 20 kW and a wavelength greater than about 1550 nm; and
   wherein the optical beam includes a single mode and is diffraction-limited.

* * * * *